(12) United States Patent
Enichen

(10) Patent No.: US 6,320,187 B1
(45) Date of Patent: Nov. 20, 2001

(54) MAGNIFICATION AND ROTATION CALIBRATION PATTERNS FOR PARTICLE BEAM PROJECTION SYSTEM

(75) Inventor: William Albert Enichen, Poughkeepsie, NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/455,681

(22) Filed: Dec. 7, 1999

(51) Int. Cl.[7] .............................. G01R 23/02; G12B 13/00
(52) U.S. Cl. ............................. 250/252.1; 250/492.2; 250/491.1
(58) Field of Search .................... 250/492.2, 492.23, 250/192.27, 252.1, 491.1; 355/77

(56) References Cited

U.S. PATENT DOCUMENTS

| | | | |
|---|---|---|---|
| 5,079,112 | 1/1992 | Berger et al. | 430/4 |
| 5,283,440 | 2/1994 | Sohda et al. | 250/492.2 |
| 5,316,879 | 5/1994 | Berger et al. | 430/5 |
| 5,763,894 | 6/1998 | Enichen et al. | 250/492.2 |
| 5,766,894 | * 6/1998 | Enrichen et al. | 250/492.2 |
| 5,911,858 | * 6/1999 | Ruffner | 204/192.27 |
| 5,936,252 | * 8/1999 | Stickel et al. | 250/492.23 |
| 6,115,108 | * 9/2000 | Capodieci | 355/77 |

OTHER PUBLICATIONS

Scalpel, www.bell–labs.com/project/Scalpel (1999) pp. 1–41 (page numbers added).

* cited by examiner

Primary Examiner—Jack Berman
Assistant Examiner—Johnnie L Smith, II
(74) Attorney, Agent, or Firm—Graham S. Jones, II (57) ABSTRACT

A method of calibrating a projection particle beam lithography system, comprises the following steps which is embodied in a system provides a magnification reticle pattern of features and a magnification target pattern. Provide a rotation reticle pattern of features and a rotation target pattern, and a particle beam. Direct the particle beam through the magnification reticle pattern and scan its image over the magnification target pattern. Determine the distance between peaks of target patterns as indicated by particles backscattered from the magnification target pattern. Calculate the deviation from a standard for the distance between peaks of target patterns from the magnification target pattern and calculate the magnification deviation and use the magnification deviation to adjust the particle beam. Direct the particle beam through the rotation reticle pattern and scan its image over the rotation target pattern. Determine the distance between peaks of target patterns as indicated by particles from the rotation target pattern. Calculate the deviation for the distance between peaks of the rotation target pattern and calculate the rotation deviation. Then use the rotation deviation to adjust the rotational orientation of the particle beam.

31 Claims, 8 Drawing Sheets

| RETICLE | (TARGET) |
|---|---|
| LA = 1,000 μm | (250 μm) |
| LB = 600 μm | (150 μm) |
| LC = 200 μm | (50 μm) |
| LD = 24 μm | (6 μm) |
| LE = 32 μm | (8 μm) |
| LF = 888 μm | (222 μm) |

| RETICLE | (TARGET) |
|---|---|
| LA = 1,000 μm | 250 μm |
| LD = 24 μm | 6 μm |
| LH = 124 μm | 31 μm |
| LI = 100 μm | 25 μm |
| LJ = 170 μm | 42.5 μm |
| LK = 4 μm | 1 μm |
| LM = 86 μm | 21.5 μm |
| LN = 62 μm | 15.5 μm |

MAGNIFICATION AND ROTATION CALIBRATION PATTERNS FOR PARTICLE BEAM PROJECTION SYSTEM

BACKGROUND OF THE INVENTION

1. Field of the Invention

This invention relates to particle beam projection systems and more particularly to calibration of such systems.

2. Description of Related Art

See U.S. Pat. No. 5,763,894 of Enichen et al. for "Calibration Patterns and Techniques for Charged Particle Projection Lithography Systems" and U.S. Pat. No. 5,283,440 Sohda et al. for "Electron-Beam Writing System Used in a Cell Projection Method".

In an EBPS (Electron-Beam Projection System) the size and orientation (rotation) of the projected cell or subfield must be adjusted in order for subfields or cells being formed to butt against the neighboring subfields or cells without gaps or an overlap between subfields or cells.

Previous calibration methods described in U.S. Pat. No. 5,763,894, supra, and U.S. Pat. No. 5,283,440, supra, have done this adjustment task by projecting an image formed by the reticle onto a matching target in the wafer plane, and the projected image is scanned over the matching target. The degree of matching is evaluated by measuring the peak signal strength of the backscattered electron signal or by measuring the width of the backscattered electron signal at a given threshold. The lenses that control the magnification and rotation of the subfields are stepped through a range of values and data is collected from the backscattered electron detector. The optimum adjustment is determined by the lens setting that maximizes the backscattered electron signal or minimizes the backscattered electron signal width.

The problem with the techniques of U.S. Pat. No. 5,763,894, supra, and U.S. Pat. No. 5,283,440, supra, is that for a single measurement it is impossible to determine the direction in which to make an adjustment. It is necessary to make enough trial adjustments in order to establish a maximum backscattered electron signal or a minimum backscattered electron signal width. A single measurement yields no information on the degree to which the adjustment has approached proximity to an optimum adjustment or in what direction an optimum can be approached.

SUMMARY OF THE INVENTION

In accordance with this invention, a method of calibrating a projection particle beam lithography system, comprises the following steps. Provide a magnification reticle pattern and a magnification target pattern. Provide a rotation reticle pattern and a rotation target pattern. Produce a particle beam. Direct the particle beam through the magnification reticle pattern and onto the magnification target pattern. The projected reticle pattern image is scanned over the magnification target using a calibrated deflection. Determine the distance between peaks of target patterns as indicated by particles backscattered from the magnification target pattern. Calculate the deviation from the ideal for the distance between peaks of a the backscatter signal and calculate the magnification deviation and use the magnification deviation to adjust the particle beam. Direct the particle beam through the rotation reticle pattern and onto the rotation target pattern. Scan the rotation reticle pattern image over the rotation target using a calibrated deflection. Determine the distance between peaks of the signal from the particles backscattered from the rotation target pattern. Calculate the deviation from the ideal for the distance between peaks of the backscatter signal and calculate the rotation value. Then use the rotation value to adjust the rotational orientation of the particle beam.

In accordance with another aspect of this invention, a method of calibrating a projection electron beam lithography system, comprises the following steps. Provide a magnification reticle pattern and a magnification target pattern. Provide a rotation reticle pattern and a rotation target pattern. Produce an electron beam. Demagnify the electron beam. Orient the electron beam. Direct the electron beam through the magnification reticle pattern and onto the magnification target pattern. Scan the image of the magnification reticle pattern over the magnification target elements with a calibrated scan. Determine the distance between peaks of the signal produced by secondary electrons or electrons backscattered from the magnification target pattern. Calculate the deviation from the distance between peaks of an ideal signal and calculate the magnification deviation and use the magnification deviation to adjust the electron beam. Direct the electron beam through the rotation reticle pattern and onto the rotation target pattern. Scan the image of the rotation reticle pattern over the rotation target elements with a calibrated scan. Determine the distance between peaks of the signal produced by secondary electrons or electrons backscattered from the rotation target pattern. Calculate the deviation from the distance between peaks of an ideal signal and calculate the rotation deviation, then use the rotation deviation to adjust the electron beam and using the rotation value to adjust the rotational orientation of the electron beam.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

In accordance with this invention patterns on a reticle or reticles at the mask plane and patterns on the target or targets at the wafer plane are provided and used to measure the magnification and rotation of the subfield directly thereby speeding up the calibration process.

Figures 1A, 1B:
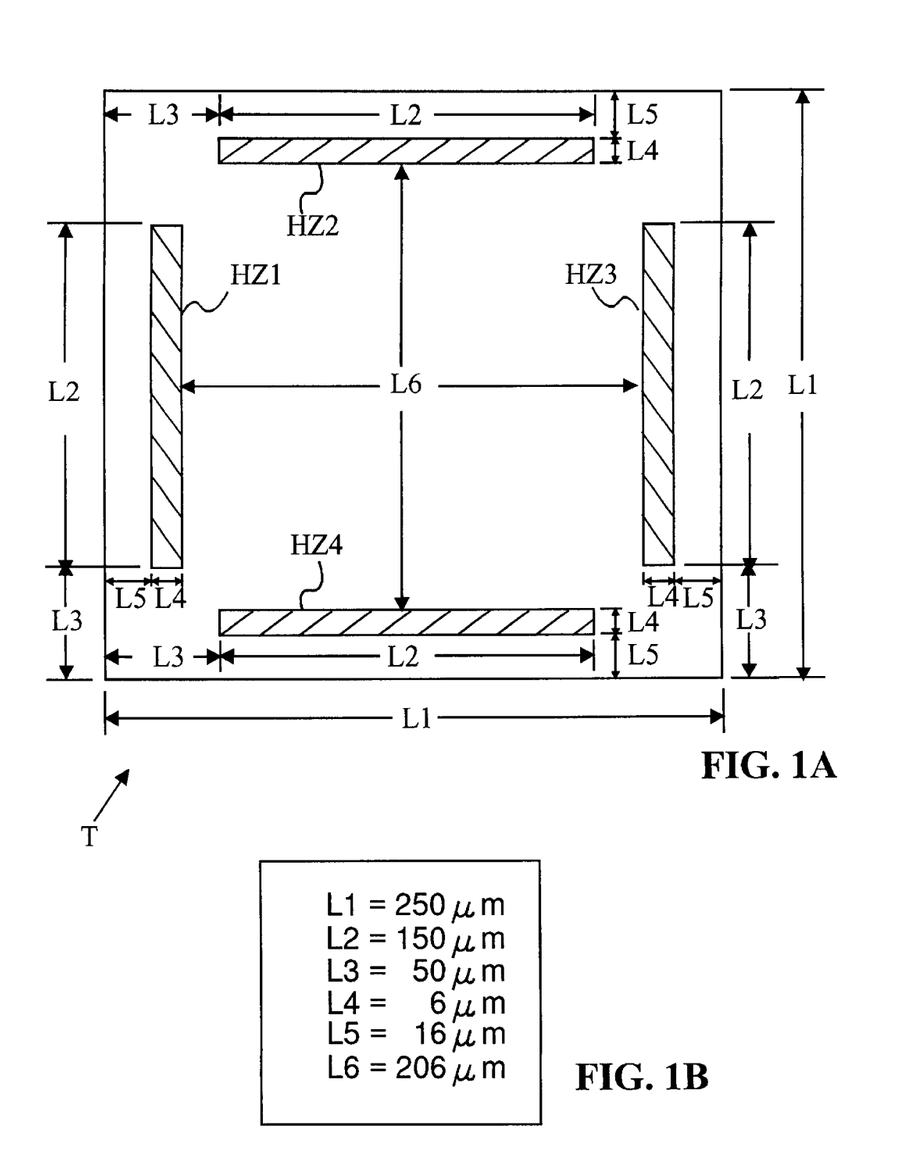
FIG. 1A shows a calibration target T in accordance with this invention for use on a projection system to calibrate the subfield magnification with a square subfield.
FIG. 1B shows a table of the dimensions of the elements of the target of FIG. 1A.

FIG. 1A shows a magnification calibration target T for use on a projection system to calibrate the subfield magnification with a square subfield with a size of 250 µm by 250 µm. The composition of the material of the alignment elements HZ1, HZ2 HZ3, and HZ4 on the magnification calibration target T is a high atomic number metal element such as gold, tantalum, or tungsten which provides strong backscattering of electrons or secondary electrons, which backscattered electrons or secondary electrons are detected easily with the backscatter detectors 50 seen in FIG. 7 which preferably are photodiodes. The alignment, backscattering elements HZ1, HZ2 HZ3, and HZ4 are elongated rectangular members formed on the top surface of the magnification calibration target T. Backscattering elements HZ1, HZ2 HZ3, and HZ4, which are proximate to and parallel to the periphery of the magnification calibration target T, will produce backscattered electrons or secondary electrons when scanned by the image of a pattern on the magnification reticle.

FIG. 1B shows a table of the dimensions of the elements of the magnification calibration target T of FIG. 1A. Thus, it can be seen that the backscattering elements HZ1, HZ2 HZ3, and HZ4 are 150 µm long and 6 µm wide are formed 16 µm from the periphery of the 250 µm×250 µm square area magnification calibration target T. The backscattering elements HZ1 and HZ3 are spaced 206 µm apart, backscattering elements HZ2 and HZ4 are also spaced 206 µm apart ,and backscattering elements HZ1, HZ2, HZ3, and HZ4 are all centered along the sides of the magnification calibration target T.

Figure 2A:
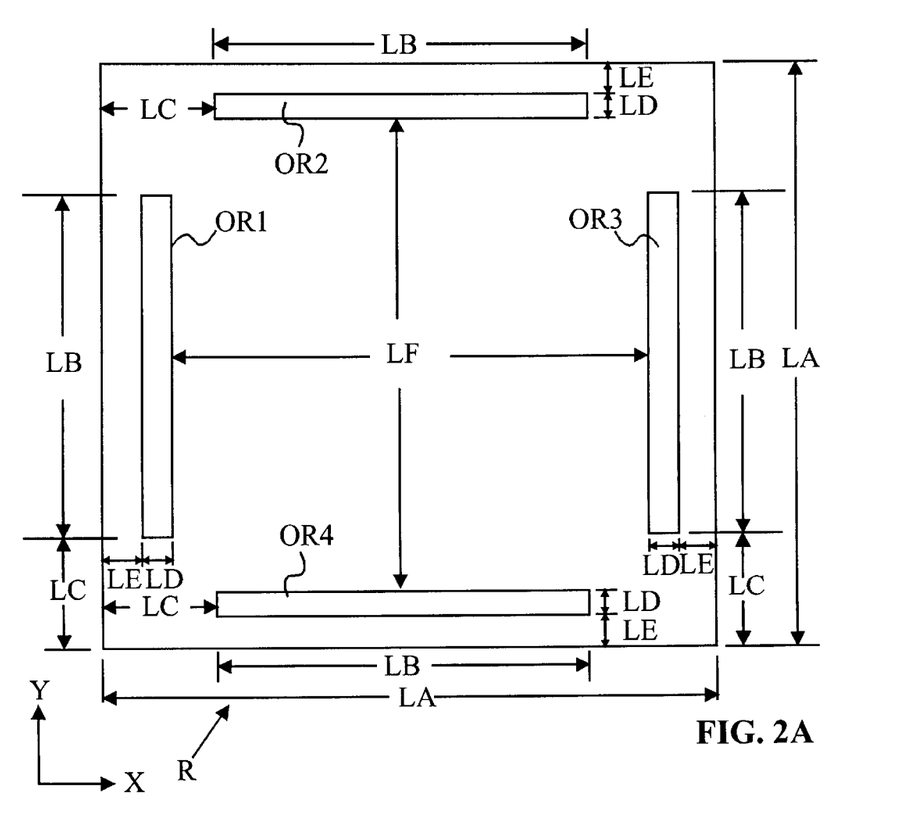
FIG. 2A shows a magnification calibration reticle R with a pattern of openings comprising features matching the pattern of the alignment elements on the magnification target T.

FIG. 2A shows a magnification calibration reticle R with a pattern of imaging features in the form of openings OR1, OR2 OR3, and OR4 matching the pattern of the alignment elements HZ1, HZ2 HZ3, and HZ4 on the magnification calibration target T. The imaging feature openings OR1, OR2 OR3, and OR4 are elongated, rectangular windows proximate to and parallel to the periphery of the reticle R. This reticle can be fabricated using a stencil mask technology where the imaging feature openings OR1, OR2, OR3 and OR4 are openings in the silicon membrane. The imaging feature openings can be substituted for by imaging features implemented with SCALPEL technology (J. A. Liddle et al. "The Scattering with Angular Limitation in Projection Electron-Beam Lithography (SCALPEL) System Jpn J. Appl. Phys. Vol. 4 6663 (1995)) where OR1, OR2, OR3 and OR4 are areas of a thin membrane which produce relatively little scattering of the beam within a region of material which produces a high degree of scattering of the beam on a thin membrane. The pattern should be in the region of low scattering with the background having the high scattering material. SCALPEL is further described in U.S. Pat. No. 5,316,879 of Berger et al and U.S. Pat. No. 5,079,112 of Berger et al.

Figure 2B:
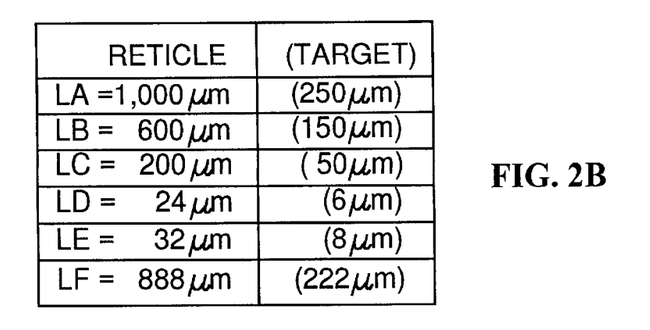
FIG. 2B shows a table of the dimensions of the elements of the magnification calibration reticle.
Figure 7:
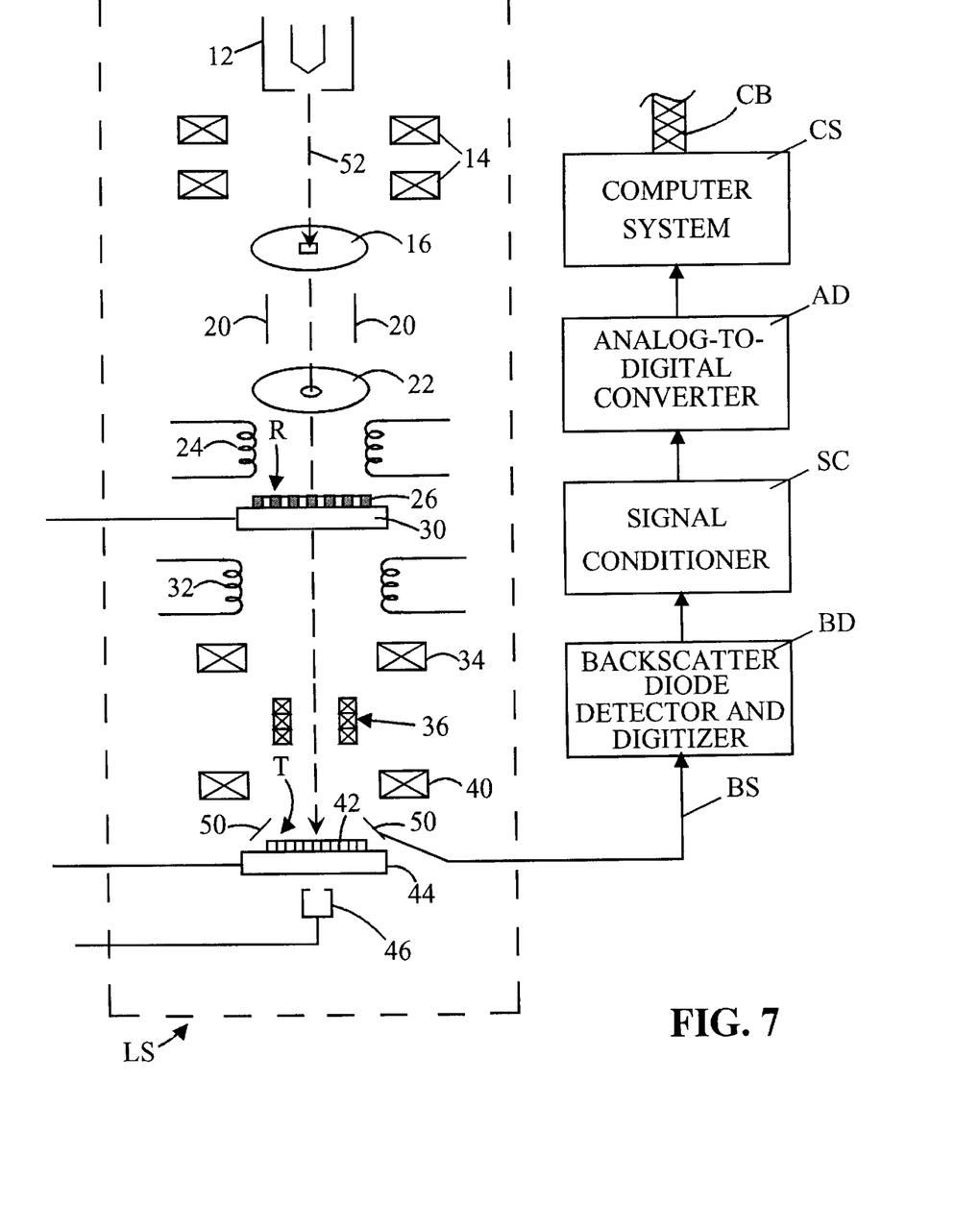
FIG. 7 schematically illustrates a projection electron beam lithography system in accordance with this device.

FIG. 2B shows a table of the dimensions of the elements of the magnification reticle R. The dimension in parentheses in the (target) column are the size of the transmitted image in the target plane using a reduction of 4:1 in the projection optics as shown in FIG. 7. The pattern is designed so that when the image produced by the reticle R is reduced 4:1 by the projection optics and is scanned over the target T, for a scan in the x direction in FIG. 2A, the right-hand bar HZ3 is scanned first and then the left-hand bar HZ1 is scanned second producing the two peaks P1 and P2 illustrated on curve SA1 in FIG. 3.

It can be seen that the imaging feature openings OR1, OR2 OR3, and OR4 are 600 µm long and 24 µm wide are formed 32 µm from the periphery of the 1,000 µm×1,000 µm square area magnification calibration target R. The imaging feature openings OR1 and OR3 are spaced 888 µm apart. The imaging feature openings OR2 and OR4 are also spaced 888 µm apart. The imaging feature openings OR1, OR2 OR3, and OR4 are all centered along the sides of the magnification calibration target T.

Figure 3:
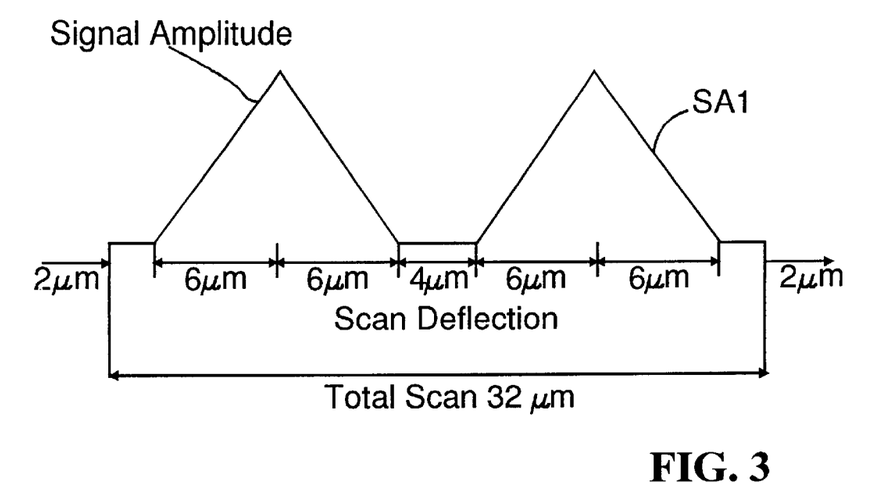
FIG. 3 shows the desired signal, i.e. the signal which is expected to be produced when the reticle image is scanned over the target of FIGS. 1A and 2A if the beam is properly adjusted and calibrated.
Figure 8A:
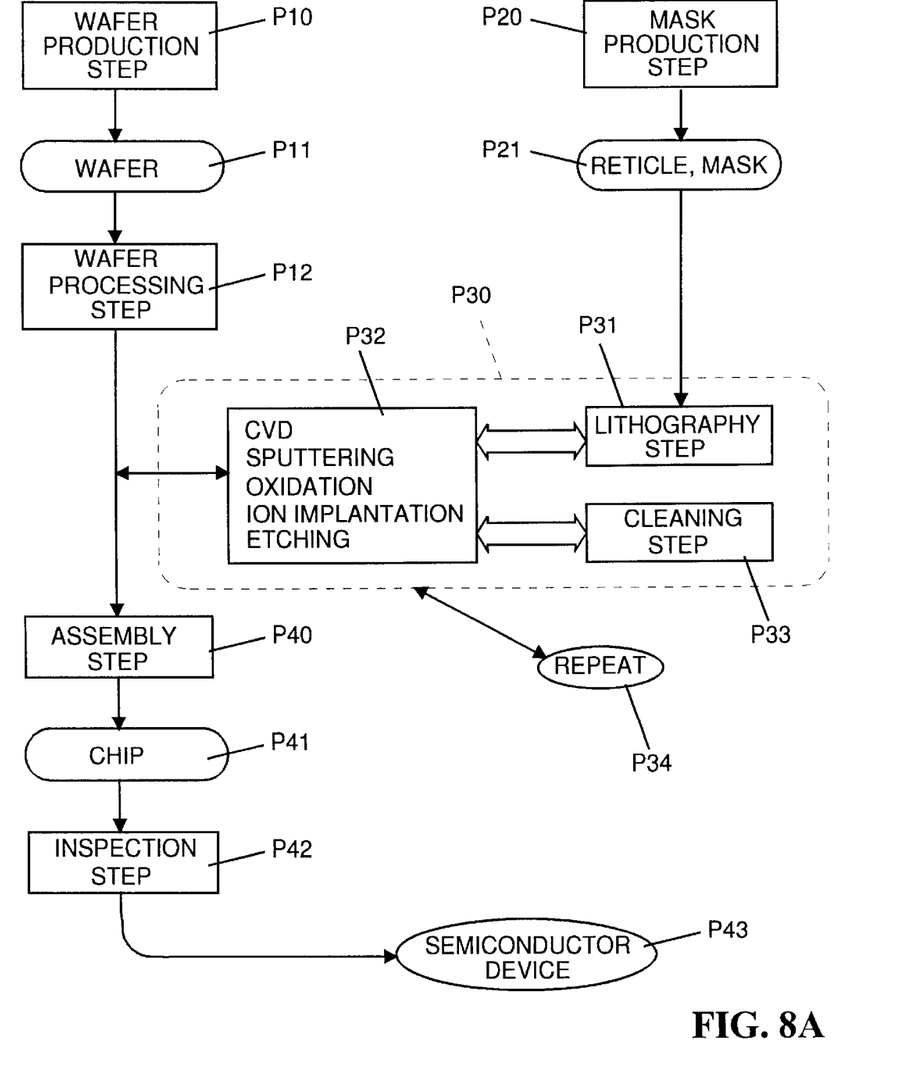
FIG. 8A shows a schematic block diagram of a process for manufacture of a semiconductor chip employing the tool of this invention for manufacture of a semiconductor chips.

The scan described above results in a signal SA1 with the two pulses P1 and P2 shown in FIG. 3 are generated by backscattered electrons or secondary electrons in response to the electron beam which can be used in the method described by FIG. 8A. FIG. 3 shows the desired signal SA1, i.e. the signal which is expected to be produced an ideal scan as described above if the beam is properly adjusted and calibrated. The distance D between the peaks of the two pulses P1 and P2 can be measured using standard techniques such as multiple clip levels or a moment calculation. The nominal distance between the two pulses P1 and P2 is designed to be 16 µm. In cases in which the actual distance between two pulses P1 and P2 is the nominal distance of exactly 16 µm, then there is no deviation. Any deviation from the nominal value indicates a magnification deviation. The magnification deviation is given by the deviation from nominal divided by the distance of the centerlines of the openings (for example as shown below 228 µm) on the reticle R scaled by the demagnification factor of the projection optics.

The distance D between the peaks for the aspect of the method of this invention as illustrated by FIGS. 1A, 2A and 3 is the Peak Distance–16 µm.

"Magnification Deviation" is defined as follows:

$$\text{Magnification Deviation} = \frac{\text{Magnification Peak Distance} - 16\,\mu m}{\text{Distance of centerlines of openings}} \quad (1)$$

Using the specific values given in the examples of FIGS. 1A, 1B, 2A, 2B and 3 the Magnification Deviation is as follows:

$$\text{Magnification Deviation} = \frac{\text{Magnification Peak Distance} - 16\,\mu m)}{228\mu m} \quad (2)$$

This result can be used to determine the correction to be applied to correct any error in magnification caused by the magnification deviation. This result yields both the sign and magnitude of the correction required to make the subfield the correct size. If the peak distance is smaller than nominal the subfield is too small. Conversely, if the peak distance is larger than nominal, the subfield is too large. The value of the magnification deviation in the y direction in FIG. 2A is determined by scanning in the y direction as will be well understood by those skilled in the art.

Figure 4A:
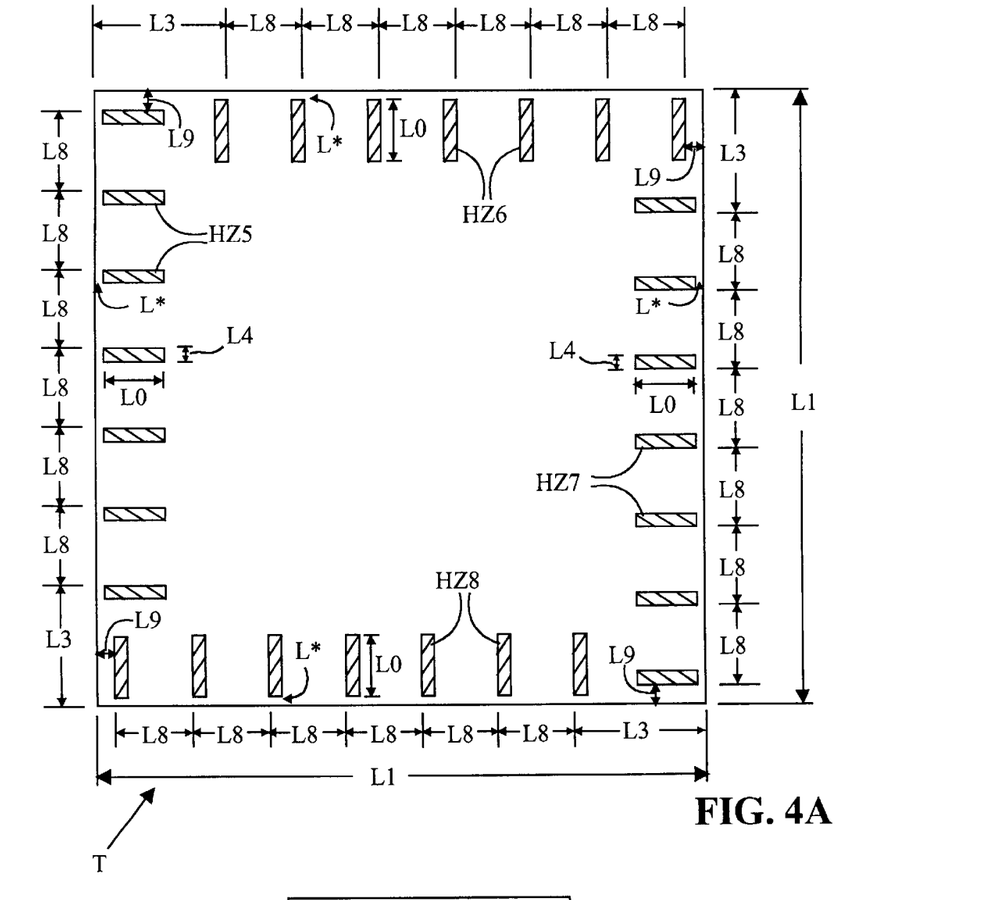
FIG. 4A shows a rotation target T in accordance with this invention for use on a projection system to calibrate the subfield magnification with a square subfield.
Figure 4B:
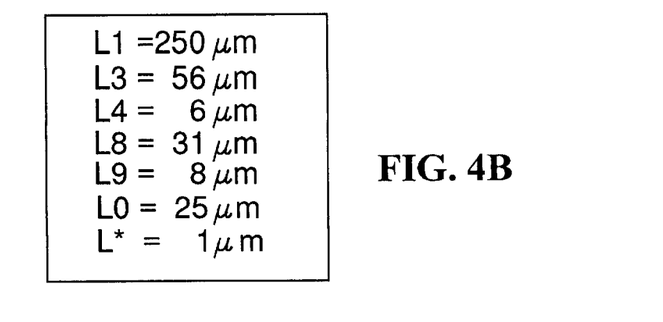
FIG. 4B shows a table of the dimensions of the elements of the target of FIG. 4A.

Referring to FIG. 4A, a variation of the technique of FIGS. 1, 2 and 3 and FIG. 9A can be used to measure the rotation of the subfield. FIG. 4A shows a rotation calibration target T adapted for determining rotation with a pattern of short backscattering stripes HZ5, HZ6, HZ7, and HZ8 perpendicular to the adjacent periphery of the target T. The short backscattering stripes HZ5, HZ6, HZ7, and HZ8 are four sets of short, parallel rectangles formed on the top surface of the target T proximate to and perpendicular to the adjacent periphery of the target T.

Referring again to FIG. 4A the elements HZ6, HZ7, HZ8 and HZ5 are spaced along the top right, bottom and left sides respectively of the target T with an alignment obtained simply by rotating the elements in consecutive rotations from the elements HZ6 in the top row. It can be seen that the backscattering elements HZ5, HZ6, HZ7, and HZ8 which are 25 $\mu$m long and 6 $\mu$m wide, are formed 1 $\mu$m from the periphery of the 250 $\mu$m×250 $\mu$m square area rotation calibration target T. Along the top edge of target T, there are seven upright backscattering elements HZ6 which are spaced apart by a distance L8 of 31 $\mu$m along the edges of the target T with the first element HZ6 being spaced a distance L9=8 $\mu$m from the right edge of the target T.

The tip end of each element HZ5, HZ6, HZ7, and HZ8 is located near the edge of rotation calibration target T, spaced only 1 $\mu$m from the edge of the target T. The twenty-eight (four groups of seven) backscattering elements HZ5, HZ6, HZ7, and HZ8 are spaced 31 $\mu$m apart in each group of seven of those elements.

Figure 5A:
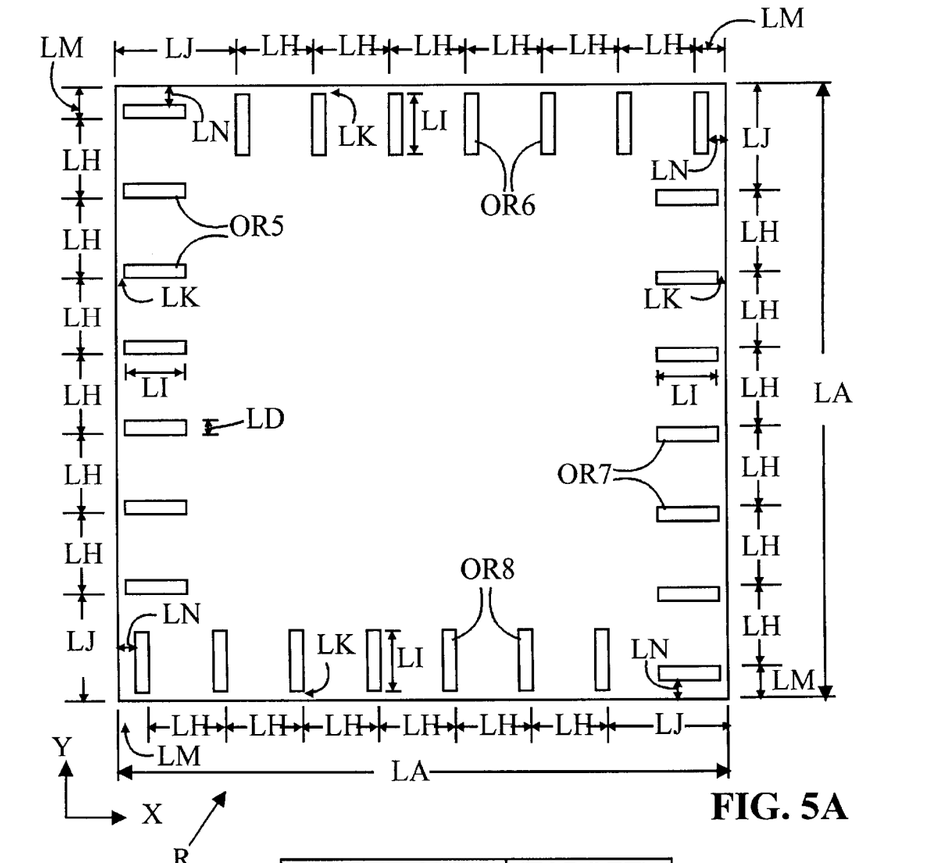
FIG. 5A shows a rotation calibration reticle R with a pattern of openings comprising features matching the pattern of the alignment elements on the rotation target T.

FIG. 5A shows a rotation calibration stencil reticle R with the imaging feature openings OR5, OR6, OR7, and OR8 therethrough in a pattern corresponding to the rotation portion of target T of FIG. 4A. In this embodiment, the image produced by the rotation portion of reticle R is scanned over the rotation portion of target T. At the bottom of the subfield the image from imaging feature openings OR8 in FIG. 5A and the bars HZ8 in FIG. 4A come into coincidence first. Then the image from imaging feature openings OR6 in FIG. 5A the bars HZ6 in FIG. 4A at the top of the subfield come into coincidence second. This results in the two peaks P1' and P2'; shown in FIG. 6. Imaging feature openings OR5, OR6, OR7, and OR8 are elongated rectangular windows through the reticle R proximate to and perpendicular to the adjacent periphery of the reticle R.

Alternatively, in place of the stencil reticle described above, a reticle using a SCALPEL (SCattering with Angular Limitation in Projection Electron-beam Lithography) design, as described above can be used.

Figure 5B:
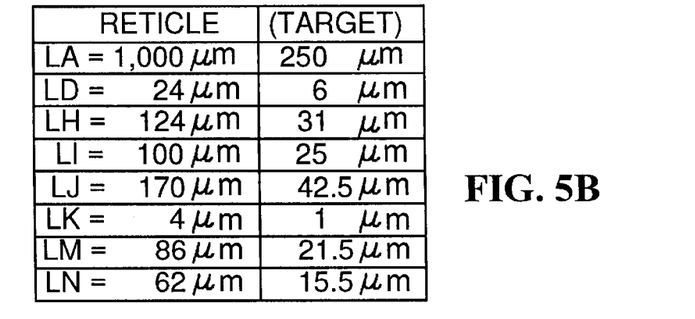
FIG. 5B shows a table of the dimensions of the elements of the rotation calibration reticle.

FIG. 5B shows a table of the dimensions of the elements of the rotation reticle R, and the table is structured as the table in FIG. 2B above. The dimension in parentheses in the (target) column are the size of the transmitted image in the target plane using a reduction of 4:1 in the projection optics as shown in FIG. 7. The pattern is designed so that when the rotation image produced by the rotation reticle R is reduced 4:1 by the projection optics and is scanned over the target T, for a scan in the x direction in FIG. 5A, the bottom bars HZ8 are scanned and then the top bars HZ6 are scanned second.

Referring again to FIG. 5A, the elements OR6, OR7, OR8, and OR5 are spaced along the top, right, bottom and left sides respectively of the reticle R with an alignment obtained simply by rotating the elements in consecutive rotations from the elements HZ6 in the top row. It can be seen that the rotation calibration imaging feature openings OR5, OR6, OR7, and OR8 are 100 $\mu$m long and 24 $\mu$m wide are formed LN=62 $\mu$m from the periphery of the LA×LA= 1,000 $\mu$m×1,000 $\mu$m square area rotation calibration reticle R. The imaging feature openings OR5, OR6, OR7, and OR8 are spaced a distance LH of 124 $\mu$m along the edges of the rotation calibration reticle R with the first spaced distance LN=62 $\mu$m from the edge of the target T and the tip end each imaging feature openings OR5, OR6, OR7, and OR8 is spaced only LK=4 $\mu$m from the edge of the rotation calibration reticle R. The rotation calibration, imaging feature openings OR5, OR6, OR7, and OR8 are spaced with a periodicity of 124 $\mu$m.

Figure 6:
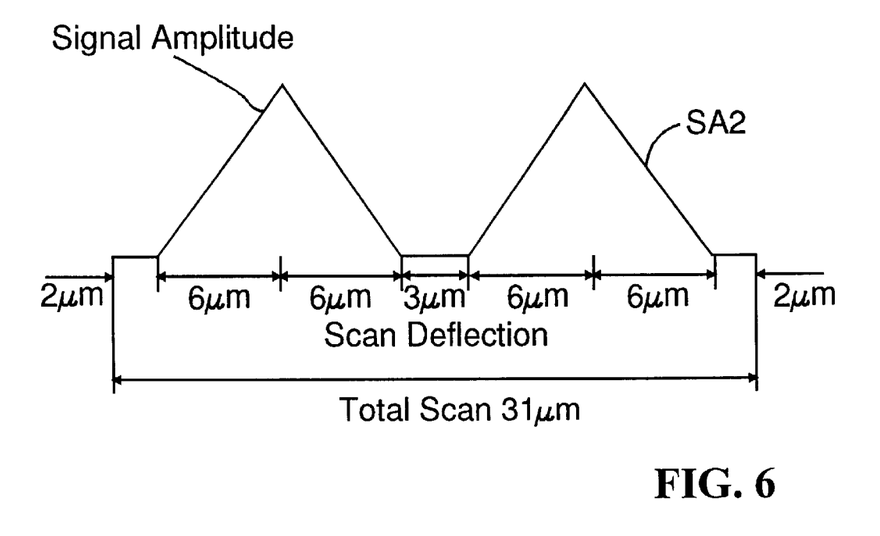
FIG. 6 shows the desired signal, i.e. the signal which is expected to be produced when the reticle image is scanned over the target T of FIGS. 4A and 5A if the beam is properly adjusted and calibrated.

FIG. 6 shows the desired signal SA2 with pulses P1' and P2', i.e. the signal which is expected to be produced when the image of the reticle R is scanned by a ±15.5 $\mu$m calibration scan, as described above if the beam is properly adjusted and calibrated. Based on the patterns on the rotation reticle R and the rotation target T the distance between the pulses P1' and P2' in FIG. 6 is 15 $\mu$m. Any deviation from that value is due to rotation of the subfield. The distance DR between the peaks P1' and P2' can be determined using standard techniques.

One component of the Rotation Deviation for the aspect of the method of this invention as illustrated by FIGS. 4A, 5A and 6 is the Rotation Peak Distance−15 $\mu$m.

The Rotation Deviation ratio is defined by the equation as follows:

$$\text{Rotation Deviation} = \frac{\text{Rotation Peak Distance} - 15 \mu m}{\text{Distance between the rows of bars}} \quad (3)$$

Using the specific values given in the examples of FIGS. 4A, 4B, 5A, 5B and 6 the Rotation Deviation is as follows:

$$\text{Rotation Deviation} = \frac{\text{Rotation Peak Distance} - 15 \mu m}{223 \ \mu m.} \quad (4)$$

This result can be used to determine the correction to be applied to correct any error caused by the rotation deviation. The sign (+/−) of the result indicates the direction of the rotation deviation. A positive (+) result represents a counter-clockwise rotation deviation of the image of the reticle with respect to the wafer target. A negative (−) result indicates a clockwise rotation deviation of the reticle image with respect to the wafer target.

Practical Application

FIG. 7 is a schematic diagram which illustrates an electron beam lithography system LS controlled by a conventional electron beam lithography system computer CS through connections to cable CB which are cut away for convenience of illustration. The lithography system LS includes an electron gun 12 (which emits electron beam 52) condenser lenses 14, illumination shaping aperture 16, blanking plates 20, blanking aperture 22, mask deflection yoke 24, mask 26, mask stage 30, post deflection yoke 32, reduction lens 34, rotation/magnification correction lenses 36, objective lens 40, wafer 42, target T, wafer stage 44, transmission detector 46 and backscatter detectors 50. In operation of system LS, electron gun 12 emits electron beam 52 directed through illumination shaping aperture 16, which forms the beam 52 into a particular cross-sectional shape. The shaped beam 52 is then positioned by the mask deflection yoke 24 onto either mask 26 or reticle R, which further forms the cross-sectional shape of the beam 52.

In accordance with a preferred embodiment of the invention, salient elements of a projection lithography system LS are shown in FIG. 7. The reticle R and the mask 26 are both supported on the mask stage 30, with the reticle R being permanently mounted on mask stage 30, aside from the location of mask 26, to be used with different masks 26. In a similar manner, the target T and the wafer 42 are both supported on the wafer stage 44, with the target T being permanently mounted on the wafer stage 44, aside from the location of the wafer 42 for use with wafers 42 placed on the wafer stage 44.

Once the final shape of the electron beam 52 is determined, under the control of computer system CS, the correction lenses 36 may be used to adjust the rotation, magnification, and focus of the electron beam 52. Electron beam 52 is then incident on either target T or wafer 42, which are supported by wafer stage 44. The lens 34 would be adjusted once and all small corrections would be made through correction lenses 36. Wafer 42 is coated with an electron sensitive resist material, and the electron beam2 exposes that resist to a pattern dictated by the illumination aperture 16 and the mask 26. Transmission detector 46 is used to detect and to generate signals representing the intensity of the electrons passing through the wafer 42 or the target T. A set of backscatter photodiodes 50 is provided to detect and to generate signals representing the intensity of the secondary electrons or electrons scattered upward from the target T or the wafer 42.

Figure 9A:
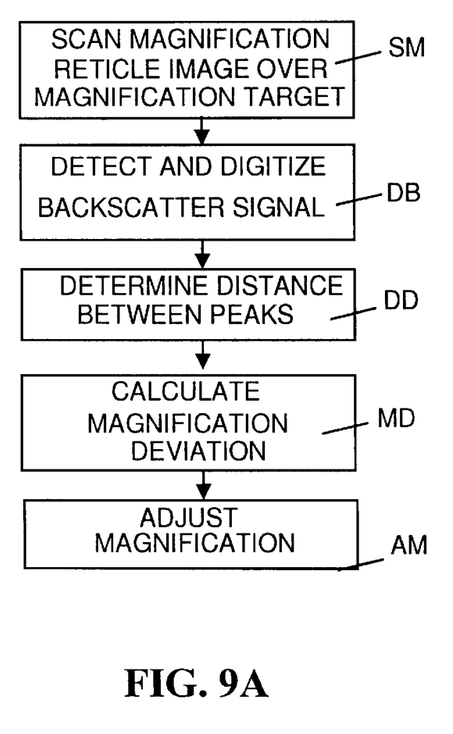
FIG. 9A is a flow chart showing the steps leading to adjustment of the magnification in accordance with this invention.
Figure 9B:
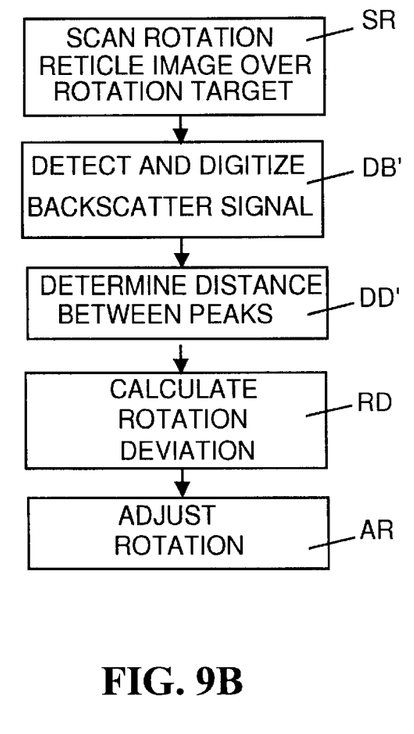
FIG. 9B is a flow chart showing the steps leading to adjustment of the rotation in accordance with this invention.

The flow chart of FIG. 9A shows the steps leading to adjustment of the magnification as a function of magnification deviation in accordance with this invention. FIG. 9B is a flow chart showing steps that lead to adjustment of rotation as a function of rotation deviation in accordance with this invention. At this point in FIG. 7, referring to FIG. 9A, in step SM there were scans of the magnification of the first, reticle image over the first target; and referring to FIG. 9B, in step SR there were scans of the rotation of the second, reticle image over the second target.

Referring again to FIG. 7, the backscattered electrons or secondary electrons produce signals from backscatter photodiodes 50 which are received by backscatter diode detector BD which passes signals along to the signal conditioner SC. Then the conditioned signals pass into analog-to-digital converter AD (digitizers) and from there to the computer system CS for determining the distance between peaks. Referring again to FIGS. 9A and 9B in blocks DB and DB' respectively it is indicated that at this stage, the backscatter signal is detected (detector BD) and digitized (analog-to-digital converter AD).

Presently "multiple clip levels" OR "moment calculation" are performed in the computer system CS in FIG. 7, but they can be done in dedicated digital hardware as will be well understood by those skilled in the art.

Referring again to FIGS. 9A and 9B, the computer system CS determines the distance between peaks (Peak Distance) in steps DD and DD' respectively.

Then the output passes to the computer system which controls the lithography system LS.

In step MD, in FIG. 9A, the value of Magnification Deviation is calculated according to equation (1) above.

In step RD, in FIG. 9B, the value of Rotation Deviation is calculated according to equation (1) above.

Referring to FIG. 9A step AM, Magnification is adjusted in by computer system CS.

Referring to FIG. 9B step AR, Rotation is adjusted in by computer system CS.

Conventional or standard elements may be used in system LS. In addition, as will be understood by those of ordinary skill in the art, system LS may be provided with additional or different elements depending on the intended use of the system. Also, it may be noted that, typically, the magnification lens in system LS is used to reduce the size, or to demagnify, the electron beam 52. The present invention may be used both in charged particle projection lithography systems in which the size of the electron beam 52 is decreased and in such system in which the size of the electron beam 52 is increased. Thus, the term "magnification" is used herein, and in the appended claims, to mean either increasing or decreasing the size of the electron beam 52.

The reticle R of FIGS. 1A (located next to mask 26) and the target T (located next to wafer 42) are used during a calibration procedure in accordance with this invention before exposure of the wafer.

The system of FIG. 7 can be employed as a semiconductor manufacturing tool as will be well understood by those skilled in the art of semiconductor manufacturing. As an example, FIG. 8A shows a schematic block diagram of a process for manufacture of a semiconductor chip. FIG. 8A shows an example of a flow chart of semiconductor fabrication method to which the apparatus of this invention can be applied easily employing the calibration method of this invention. The semiconductor fabrication method comprises mainly a wafer production step P10 (or wafer preparation step) which produces a finished wafer in step P11, a mask production step P20 (or mask preparation step) which produces a finished reticle, mask in step P21, a wafer processing step P12, an assembly step P40 yielding a chip P41 and an inspection step P42. Each step comprises several substeps as will be well understood by those skilled in the art. Among these main steps, the wafer processing step P12 is a most important step to achieve the specified finest pattern width and registration limit. In this step, the designed circuit patterns are stacked successively on the wafer from step P11 and many operative semiconductor chips like memory devices or MPC are formed on the wafer from step P11.

The wafer processing steps P12 comprises a step of thin film formation wherein a dielectric layer for insulation is formed or a metal layer for lead lines and for electrodes is formed. An oxidization step can be employed to oxidize the thin film or the wafer substrate. A lithography step P31 involves use of the reticle/mask P21 to form a photoresist or other resist pattern to process the thin film or wafer substrate selectively, a selected set of process steps P32 including etching the thin film or wafer substrate and implanting ions or impurities into the thin film or wafer substrate using the resist pattern from step P31 as a mask. There is the conventional resist stripping step to remove the resist from the wafer and chip inspection step. As indicated at P34, the wafer processing steps P30 are repeated as many times as necessary to make a semiconductor chip be operable as designed, as will be well understood by those skilled in the art.

Figure 8B:
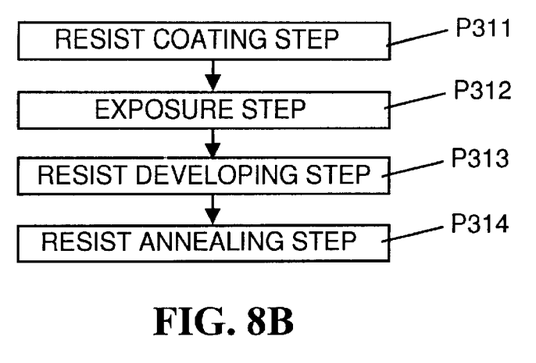
FIG. 8B shows a flow chart of lithography steps which are dominant steps in the wafer processing steps of FIG. 7A.

FIG. 8B shows a flow chart of lithography steps P31 of FIG. 8A which are dominant steps in the wafer processing steps P12/P30. Lithography steps P31 comprise a resist-coat step P311 in which the wafer substrate is coated with resist on circuit elements formed in a previous steps. An exposure step P312 then exposes the wafer coated with resist through the reticle/mask of step P21 employing a deflector in accordance with this invention. A resist development step P313 follows for developing the resist exposed in exposure step P312 followed by a resist annealing step P314 performed to enhance durability of the resist pattern produced in step P313.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of calibrating a projection particle beam lithography system, comprising the steps of:
   providing an image of a magnification reticle pattern of magnification features and a magnification target pattern of magnification target elements,
   providing a rotation reticle pattern of rotation pattern features and a rotation target pattern of target elements,
   producing a particle beam,
   directing the particle beam through said magnification reticle pattern and onto said magnification target pattern,
   scanning said image of said magnification reticle pattern across said magnification target elements with a calibrated deflection,
   determining the distance between peaks of target patterns as indicated by particles backscattered from said magnification target pattern,
   calculating the deviation from a standard for said distance between peaks of target patterns from said magnification target pattern,
   calculating the magnification deviation,
   directing the particle beam through the rotation reticle pattern and onto the rotation target pattern,
   scanning the image of said rotation reticle pattern across said rotation target elements with a calibrated deflection,
   determining the distance between peaks of target patterns as indicated by particles backscattered from said rotation target pattern, and
   calculating the deviation from a standard for said distance between peaks of said rotation target pattern and calculating the rotation deviation with respect to rotational orientation.

2. The method of claim 1 where said target elements are composed of high atomic number elements.

3. The method of claim 1 where said target elements are composed of high atomic number elements selected from the group consisting of gold, tantalum, and tungsten.

4. The method of claim 1 wherein:
   said magnification features and said magnification target elements are elongated rectangles formed adjacent to and parallel to the periphery of a magnification calibration region, and said rotation features and said rotation target elements comprise an array of short rectangles formed adjacent to and perpendicular to the periphery of a magnification calibration region.

5. The method of claim 1 wherein:
   said magnification features and said magnification target elements are elongated rectangles formed adjacent to and parallel to the periphery of a square magnification calibration region, and
   said rotation features and said rotation target elements comprise an array of short rectangles formed adjacent to and perpendicular to the periphery of a square magnification calibration region.

6. The method of calibrating a projection particle beam lithography system of claim 1 including the step of adjusting said particle beam using said magnification deviation.

7. The method of claim 1 including the step of adjusting said rotational orientation using said rotation deviation.

8. A method of calibrating a projection electron beam lithography system, comprising the steps of:
   providing a magnification reticle pattern and a magnification target pattern,
   providing an image of a rotation reticle pattern and a rotation target pattern,
   producing an electron beam,
   directing the electron beam through said magnification reticle pattern and onto said magnification target pattern,
   scanning said image of said magnification reticle pattern across said magnification target elements with a calibrated deflection,
   determining the distance between peaks of target patterns as indicated by secondary electrons or electrons backscattered from said magnification target pattern,
   calculating the deviation from a standard for said distance between peaks of target patterns from said magnification target pattern and calculating the magnification deviation,
   directing the electron beam through the rotation reticle pattern and onto the rotation target pattern,
   determining the distance between peaks of target patterns as indicated by secondary electrons or electrons backscattered from said rotation target pattern, and
   calculating the deviation from a standard for said distance between peaks of said rotation target pattern and calculating the rotation deviation with respect to rotational orientation.

9. The method of calibrating a projection electron beam lithography system in accordance with of claim 8 where said target elements are composed of high atomic number elements.

10. The method of claim 8 where said target elements are composed of high atomic number elements selected from the group consisting of gold, tantalum, and tungsten.

11. The method of claim 8 wherein:
    said magnification features and said magnification target elements are elongated rectangles formed adjacent to and parallel to the periphery of a magnification calibration region, and
    said rotation features and said rotation target elements comprise an array of short rectangles formed adjacent to and perpendicular to the periphery of a magnification calibration region.

12. The method of claim 8 wherein:
    said magnification features and said magnification target elements are elongated rectangles formed adjacent to and parallel to the periphery of a square magnification calibration region, and
    said rotation features and said rotation target elements comprise an array of short rectangles formed adjacent to and perpendicular to the periphery of a square magnification calibration region.

13. The method of claim 8 including the step of adjusting said particle beam using said magnification deviation.

14. The method of claim 8 including the step of adjusting said rotational orientation using said rotation deviation.

15. The method of claim 8 including the following steps:
magnifying the electron beam,
orienting the electron beam, and
adjusting said rotational orientation using said rotation deviation.

16. A projection particle beam lithography system with means for calibration thereof comprising:
a magnification reticle pattern of magnification features and a magnification target pattern of magnification target elements,
a rotation reticle pattern of rotation pattern features and a rotation target pattern of target elements,
a particle beam,
projection means for directing the particle beam through said magnification reticle pattern and onto said magnification target pattern,
scanning means for scanning an image of said magnification reticle pattern across said magnification target elements with a calibrated deflection,
first measurement means for determining the distance between peaks of target patterns as indicated by particles backscattered from said magnification target pattern,
first calculation means for calculating the deviation from a standard for said distance between peaks of target patterns from said magnification target pattern and calculating the magnification deviation,
guidance means for directing the particle beam through the rotation reticle pattern and onto the rotation target pattern,
second measurement means for determining the distance between peaks of target patterns as indicated by particles backscattered from said rotation target pattern, and
second calculation means for calculating the deviation from a standard for said distance between peaks of said rotation target pattern and calculating the rotation deviation with respect to rotational orientation.

17. The system of claim 16 wherein said target elements are composed of high atomic number elements.

18. The system of claim 16 wherein said target elements are composed of high atomic number elements selected from the group consisting of gold, tantalum, and tungsten.

19. The system of claim 16 wherein:
said magnification features and said magnification target elements are elongated rectangles formed adjacent to and parallel to the periphery of a magnification calibration region, and
said rotation features and said rotation target elements comprise an array of short rectangles formed adjacent to and perpendicular to the periphery of a magnification calibration region.

20. The system of claim 16 wherein:
said magnification features and said magnification target elements are elongated rectangles formed adjacent to and parallel to the periphery of a square magnification calibration region, and
said rotation features and said rotation target elements comprise an array of short rectangles formed adjacent to and perpendicular to the periphery of a square magnification calibration region.

21. The system of claim 16 including means for adjusting said particle beam using said magnification deviation.

22. The system of claim 16 including means for adjusting said rotational orientation using said rotation deviation.

23. A projection electron beam lithography system, comprising:
first pattern means for providing a magnification reticle pattern and a magnification target pattern,
second pattern means for providing a rotation reticle pattern and a rotation target pattern,
beam means for producing an electron beam,
first directing means for directing said electron beam through said magnification reticle pattern and onto said magnification target pattern,
scanning means for scanning an image of said magnification reticle pattern across said magnification target elements with a calibrated deflection,
first measuring means for determining the distance between peaks of target patterns as indicated by secondary electrons or electrons backscattered from said magnification target pattern,
first calculating means for calculating the deviation from a standard for said distance between peaks of target patterns from said magnification target pattern and calculating the magnification deviation,
second directing means for directing the electron beam through the rotation reticle pattern and onto the rotation target pattern,
second measuring means for determining the distance between peaks of target patterns as indicated by secondary electrons or electrons backscattered from said rotation target pattern, and
second calculating means for calculating the deviation from a standard for said distance between peaks of said rotation target pattern and calculating the rotation deviation with respect to rotational orientation.

24. The system of claim 23 where said target elements are composed of high atomic number elements.

25. The system of claim 23 where said target elements are composed of high atomic number elements selected from the group consisting of gold, tantalum, and tungsten.

26. The system of claim 23 wherein:
said magnification features and said magnification target elements are elongated rectangles formed adjacent to and parallel to the periphery of a magnification calibration region, and
said rotation features and said rotation target elements comprise an array of short rectangles formed adjacent to and perpendicular to the periphery of a magnification calibration region.

27. The system of claim 23 wherein:
said magnification features and said magnification target elements are elongated rectangles formed adjacent to and parallel to the periphery of a square magnification calibration region, and
said rotation features and said rotation target elements comprise an array of short rectangles formed adjacent to and perpendicular to the periphery of a square magnification calibration region.

28. The system of claim 23 including adjusting means for adjusting said electron beam using said magnification deviation.

29. The system of claim 23 including adjusting means for adjusting said rotational orientation using said rotation deviation.

30. The system of claim 23 including:

magnifying means for magnifying the electron beam, orienting means orienting for the electron beam, and adjusting means for adjusting said electron beam using said magnification deviation.

31. A semiconductor device fabrication method comprising characterized by the steps comprising:

performing wafer fabrication;

performing mask fabrication;

performing wafer processing;

performing assembly and inspection;

said method employing a charged particle projection particle beam lithography system steps calibrated by providing an image of a magnification reticle pattern of magnification features and a magnification target pattern of magnification target elements;

providing a rotation reticle pattern of rotation pattern features and a rotation target pattern of target elements;

producing a particle beam and directing said particle beam through said magnification reticle pattern and onto said magnification target pattern;

scanning said image of said magnification reticle pattern across said magnification target elements with a calibrated deflection; determining the distance between peaks of target patterns as indicated by particles backscattered from said magnification target pattern;

calculating the deviation from a standard for said distance between peaks of target patterns from said magnification target pattern and calculating magnification deviation;

directing the particle beam through the rotation reticle pattern and onto the rotation target pattern; scanning the image of said rotation reticle pattern across said rotation target elements with a calibrated deflection;

determining the distance between peaks of target patterns as indicated by particles backscattered from said rotation target pattern;

calculating the deviation from a standard for said distance between peaks of said rotation target pattern and calculating rotation deviation; and then completing the formation of said semiconductor device with said calibrated particle beam lithography system.

* * * * *